U S009254999B2

United States Patent
Chou et al.

(10) Patent No.: US 9,254,999 B2
(45) Date of Patent: Feb. 9, 2016

(54) MECHANISMS FOR FORMING MICRO-ELECTRO MECHANICAL DEVICE

(71) Applicant: Taiwan Semiconductor Manufacturing Co., Ltd, Hsin-Chu (TW)

(72) Inventors: Bruce C. S. Chou, Hsinchu (TW); Yang-Che Chen, Hsinchu (TW); Chen-Chih Fan, Zhubei (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 36 days.

(21) Appl. No.: 14/086,640

(22) Filed: Nov. 21, 2013

(65) Prior Publication Data

US 2015/0137303 A1    May 21, 2015

(51) Int. Cl.
*H01L 29/84* (2006.01)
*B81C 1/00* (2006.01)

(52) U.S. Cl.
CPC ..... *B81C 1/00246* (2013.01); *B81B 2201/0264* (2013.01); *B81B 2203/0307* (2013.01); *B81C 2203/0735* (2013.01); *B81C 2203/0771* (2013.01)

(58) Field of Classification Search
CPC .............. H01H 59/0009; H01H 59/0052
USPC .............. 257/415, 416, 417, 420, 421, 422
See application file for complete search history.

(56) References Cited

U.S. PATENT DOCUMENTS

2012/0235301 A1\* 9/2012 Ni et al. .................. 257/757
2013/0098152 A1\* 4/2013 Jeong et al. .............. 73/504.12

\* cited by examiner

*Primary Examiner* — Tan N Tran
(74) *Attorney, Agent, or Firm* — Birch, Stewart, Kolasch & Birch, LLP

(57) ABSTRACT

Embodiments of mechanisms for forming a micro-electro mechanical system (MEMS) device are provided. The MEMS device includes a substrate and a MEMS sensor over the substrate. The MEMS sensor includes a floating heater disposed over the substrate. The MEMS sensor further includes a heat sink disposed over the substrate and at a side of the floating heater, and the heat sink has an air gap with the floating heater. The MEMS sensor further includes a first plurality of vias formed through the heat sink and thermally connected to the first substrate.

20 Claims, 11 Drawing Sheets

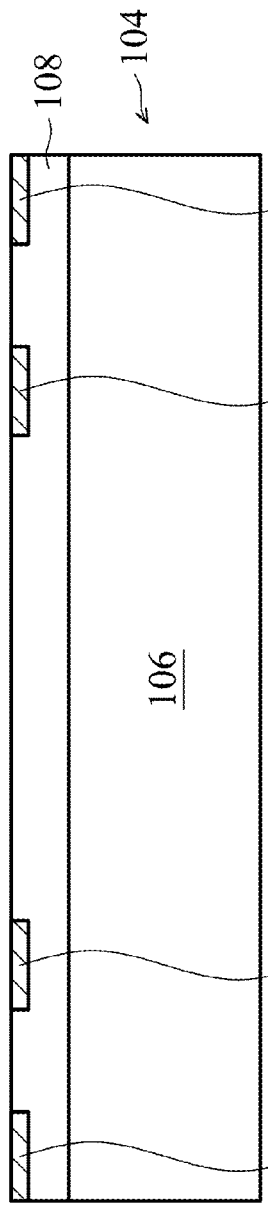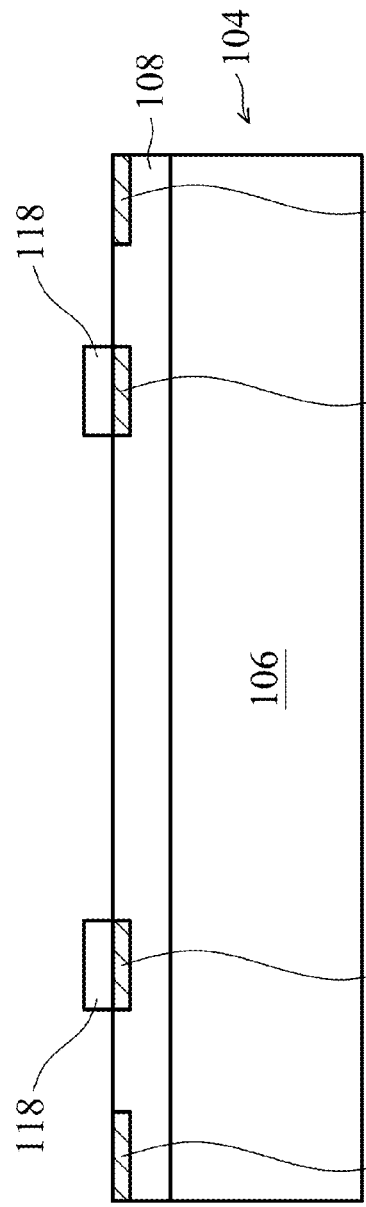

MECHANISMS FOR FORMING MICRO-ELECTRO MECHANICAL DEVICE

BACKGROUND

The semiconductor integrated circuit (IC) has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

MEMS (microelectromechanical system) devices, such as accelerometers, pressure sensors, gyroscopes, etc, have found widespread use in many modern day electronic devices. For example, MEMS accelerometers are commonly found in automobiles (e.g., in airbag deployment systems), tablet computers, and in smart phones.

In recent years, it is increasingly common for MEMS devices to be incorporated into integrated chips formed by a complementary metal-oxide semiconductor (CMOS) process. The incorporation of MEMS (e.g., sensors, integrated optics, biochips, etc.) into a CMOS process allows for widespread use of MEMS.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 6-11 collectively illustrate a more detailed manufacturing method of a MEMS device as a series of cross-sectional views, in accordance with some embodiments.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure. It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

MEMS sensor devices are often operable by sensing a characteristic of an environment surrounding the device. For example, the MEMS sensor devices may include a MEMS altimeter for sensing height and/or pressure. The MEMS altimeter is usually a mechanical MEMS sensor which measures the height and/or pressure by mechanical method. For example, the MEMS altimeter may include a cavity with a vacuum ambient (e.g., <<1 torr) encapsulated by a thin diaphragm electrode (e.g., around 1 μm). The diaphragm electrode may experience deformation when the pressure outside the cavity is changed. The deformation may induce a capacitance or resistance change, thereby being capable of sensing the height and/or pressure. However, the MEMS altimeter needs a high vacuum ambient (<<1 torr) inside the cavity, and the diaphragm electrode is easy to break up and stick to other components. Therefore, it is desirable to find alternative mechanisms for monitoring the height and/or pressure. A thermal-conductive-type altimeter, such as a Pirani vacuum sensor, may be used for detecting pressures ranging from about 0.5 torr to about $10^{-4}$ torr, but the range is far away from the ambient atmospheric pressure.

Figure 1:
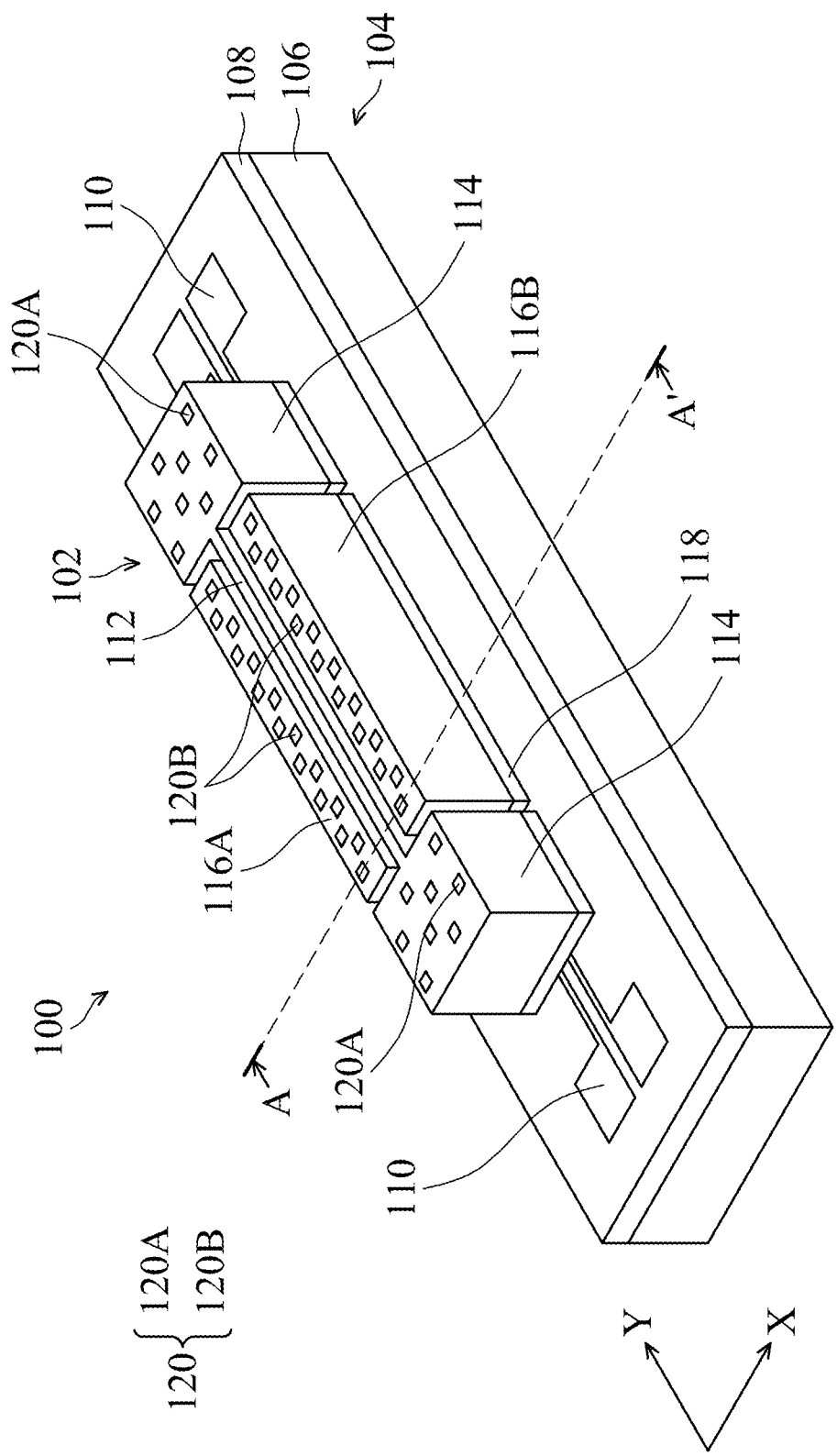
FIG. 1 illustrates a perspective view of a MEMS device capable of detecting pressures near the ambient atmospheric pressure, in accordance some embodiments.
Figure 2:
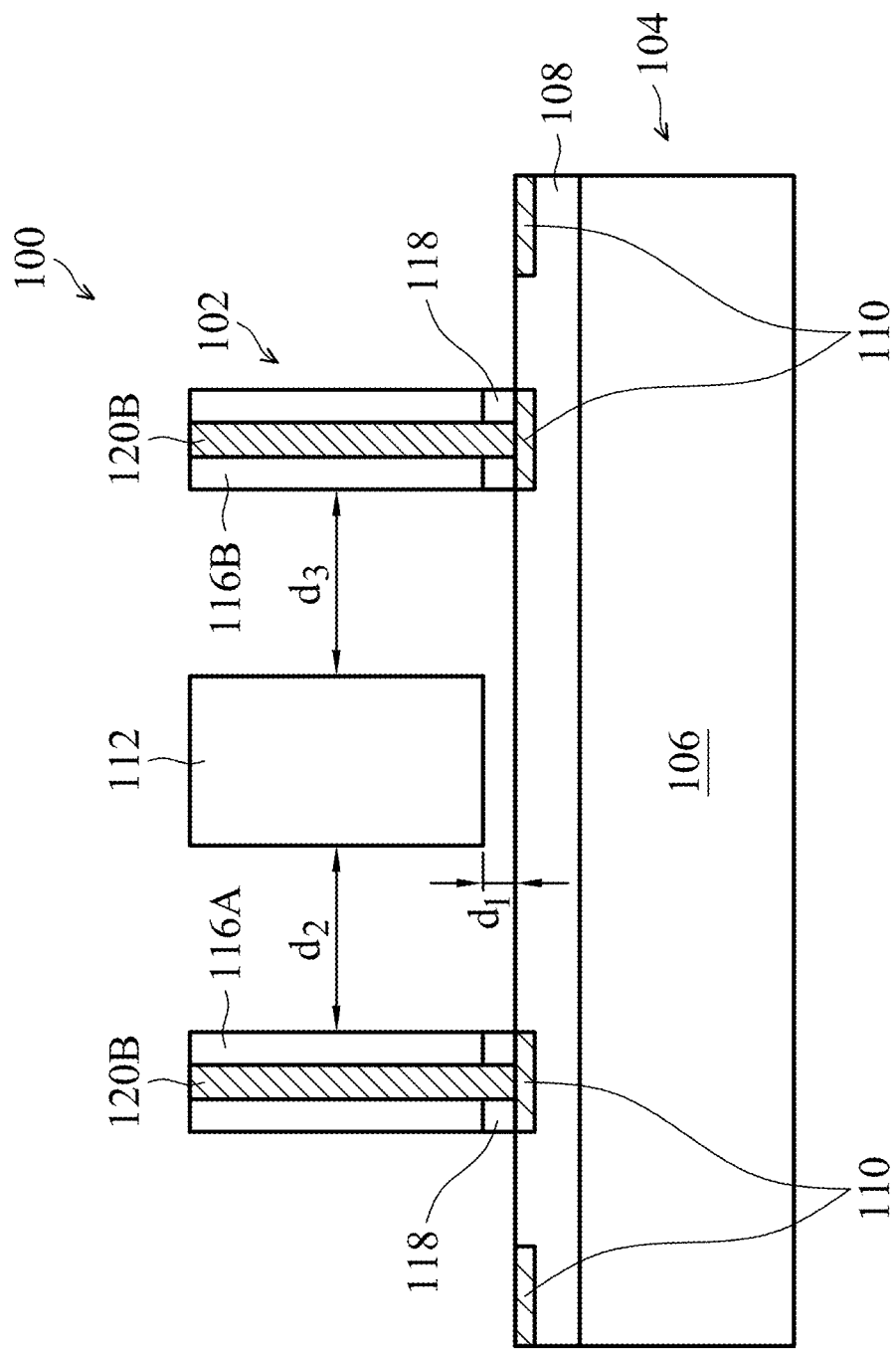
FIG. 2 illustrates a cross-sectional view of the MEMS device shown in FIG. 1 along a section A-A', in accordance with some embodiments.

FIG. 1 illustrates a perspective view of a MEMS device capable of detecting pressures near the ambient atmospheric pressure, in accordance with some embodiments. FIG. 2 illustrates a cross-sectional view of the MEMS device along a section A-A' shown in FIG. 1, in accordance with some embodiments.

Referring to FIGS. 1 and 2, the MEMS device 100 includes MEMS sensor 102 integrated with a first substrate 104 that includes one or more CMOS devices. The first substrate 104 includes a semiconductor substrate 106 and an interconnect structure 108. The semiconductor substrate 106 may be made of silicon. Alternatively, the semiconductor substrate 106 may be made of other semiconductor materials, such as silicon germanium (SiGe), silicon carbide, other suitable semiconductor materials, or combinations thereof. Other substrates may also be used. For example, the semiconductor substrate 106 may include a multi-layered substrate, gradient substrate, hybrid orientation substrate, or a combination thereof. A wide variety of device features, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), or other applicable components, may be formed in the semiconductor substrate 106. For simplicity, these device features are not illustrated in FIGS. 1 and 2.

The interconnect structure 108 is formed over the semiconductor substrate 106, as shown in FIGS. 1 and 2. The interconnect structure 108 includes a dielectric layer, which includes multiple dielectric layers, and metal layers, which include conductive bonds 110 on the top surface of the interconnection structure 108. The conductive bonds 110 may include aluminum or its alloys. Alternatively, a different conductive material suitable for eutectic bonding such as Cu, Ge, Au, In, Sn, alloys thereof, combinations thereof, stacked layers thereof, or the like may be used instead. The conductive bonds 110 may provide electrical and thermal connections between the device features in the semiconductor substrate 106 and elements of the MEMS sensor 102. The dielectric layers can be oxide dielectric, such as silicon oxide, borophsphosilicate glass (BPSG), or other dielectric materials.

The MEMS sensor 102 is formed on the first substrate 104. The MEMS sensor 102 may include a floating heater 112 supported by two anchors 114. For example, the two anchors 114 are at two ends of floating heater 112 in a first direction (e.g., the Y-direction as shown in FIG. 1). The anchors 114 are secured to the first substrate 104. The floating heater 112 is suspended by the two anchors 114 and has an air gap $d_1$ with the first substrate 104. The air gap $d_1$ may be in a range from about 1 µm to about 5 µm. The floating heater 112 may have any suitable shape from the top view, such as a rectangular shape, a zigzag shape, a wave shape, or a combination thereof. In some embodiments, the floating heater 112 has a thickness ranging from about 10 µm to about 100 µm.

In some embodiments, the MEMS sensor 102 includes a first heat sink 116A formed over the first substrate 104 and at a side of the floating heater 112 in a second direction (e.g., the X-direction shown in FIG. 1). The second direction is substantially perpendicular with the first direction. In some embodiments, the MEMS sensor 102 further includes a second heat sink 116B formed over the first substrate 104 and at another side of the floating heater 112 opposite to the first heat sink 116A. Accordingly, the first heat sink 116A and the second heat sink 116B are at the opposite sides of the floating heater 112 in the second direction. In some embodiments, the floating heater 112 has an air gap $d_2$ with the first heat sink 116A and has an air gap $d_3$ with the second heat sink 116B. In some embodiments, each of the air gap $d_2$ and the air gap $d_3$ is in a range from about 1 µm to about 5 µm. The air gap $d_2$ and the air gap $d_3$ may be the same or different. In some embodiments, the MEMS sensor 102 is embodied as long as at least one of the air gap $d_1$, the air gap $d_2$ or the air gap $d_3$ is greater than zero.

The floating heater 112, the two anchors 114, and the first and second heat sinks 116A and 116B may be made of a semiconductor material. The semiconductor material may include polysilicon, copper and aluminum.

In some embodiments, the MEMS sensor 102 includes bonding structures 118 formed under the anchors 114 and the first and second heat sinks 116A and 116B. The boding structures 118 may bond the MEMS sensor 102 to the first substrate 104. For example, the anchors 114 and the first and second heat sinks 116A and 116B are bonded to the conductive bonds 110 through the bonding structures 118. The boding structures 118 may be a fusion bond or an anodic bond. The bonding structures 118 may include silicon oxide, or a combination thereof.

In some embodiments, vias 120 (e.g., through vias) are formed through the anchors 114 and the first and second heat sinks 116A and 116B. The vias 120 may further penetrate through the bonding structures 118 for connecting the conductive bonds 114. The conductive material of the vias 120 may be, for example, copper, nickel, aluminum, copper aluminum, tungsten, titanium, gold, silver, a combination thereof, such as alloys, or the like. In some embodiments, the vias 120 are classified to vias 120A that are formed in the anchors 114 and vias 120B that are formed in the heat sinks 116A and 116B. For example, the vias 120A are electrically connected to the conductive bonds 110 in the first substrate 104, and the vias 120B are thermally connected to the conductive bonds 110 in the first substrate 104. Accordingly, the first and second heat sinks 116A and 116B may dissipate heat to the first substrate 104. The electrical characters of the floating heater 112 may be measured and processed by the device features in the semiconductor substrate 106.

In some embodiments, the MEMS device 100 further includes a cover (not shown in FIGS. 1 and 2) for protecting the MEMS sensor 102 from being damaged during the subsequent fabrication processes. The cover may be a cap substrate, which may include a semiconductor substrate, dielectric substrate, or another applicable substrate. The cap substrate may include one or more openings for allowing gases to flow into the MEMS sensor 102. The MEMS sensor 102 may be suitable for various gases, such as air, $O_2$, $N_2$, He, Ne, Ar, Kr, Xe, CO, $CO_2$, freon, or a combination thereof. In some embodiments, the cap substrate may be bonded to the first substrate 104 by eutectic bond, fusion bond, thermal compression bond, etc.

In some embodiments, the MEMS device 100 acts as an altimeter that senses pressure and/or height, although other applications are also possible. During the altimeter operation, the floating heater 112 is suspended in a gas ambient and loses heat to the gas as gas molecules collide with the floating heater 112 and remove heat from the floating heater 112. In addition, the gas molecules in the air gaps $d_1$, $d_2$ and/or $d_3$ may also collide with the heat sinks 116A and 116B and/or thermal conductive features on the first substrate 104. The heat carried by the gas molecules in the air gaps $d_1$, $d_2$ and/or $d_3$ may be removed by the vias 120B in the first heat sink 116A, the second heat sink 116B and/or the features (e.g., conductive bonds 110) on the first substrate 104. If the gas pressure is reduced, the number of gas molecules present will fall proportionately and the floating heater 112 will lose heat more slowly. In addition, the electrical resistance of the floating heater 112 may vary with its temperature. Accordingly, the heat loss of the floating heater 112 may be measured by the electrical resistance of the floating heater 112, and the gas pressure can be known from the heat loss.

The gas pressure may be in a substantially linear function with the heat loss of the floating heater 112 in a specific range. However, in addition to the gas conduction, the floating heater 112 may also lose heat by radiation and solid conduction. Furthermore, the gas molecule flow may transform to viscous flow when the gas pressure is higher than a transition pressure $P_t$. The transition pressure may determine the upper limit of the substantially linear function. In some embodiments, the transition pressure $P_t$ obeys the following equation:

$$P_t = \frac{kT}{\sqrt{2}\,\pi\sigma^2 d},$$

where k is Boltzmann constant; T is gas temperature; σ is the diameter of the gas molecule, and d is the distance between the floating heater 112 and the heat sinks 116A, 116B and/or the thermal conductive features on the first substrate 104, such as the air gaps $d_1$, $d_2$ and/or $d_3$.

Therefore, the radiation, the solid conduction and the transition pressure $P_t$ may influence the range of the substantially linear function. For example, the gas conduction can become the dominant factor of the heat loss by minimizing the radiation and the solid conduction. The lower limit of the substantially linear function may be lowered when the radiation and the solid conduction are reduced. In addition, the upper limit of the substantially linear function is increased by raising the transition pressure $P_t$, and it may be achieved by reducing the distances of the air gaps $d_1$, $d_2$, and/or $d_3$.

Figure 3:
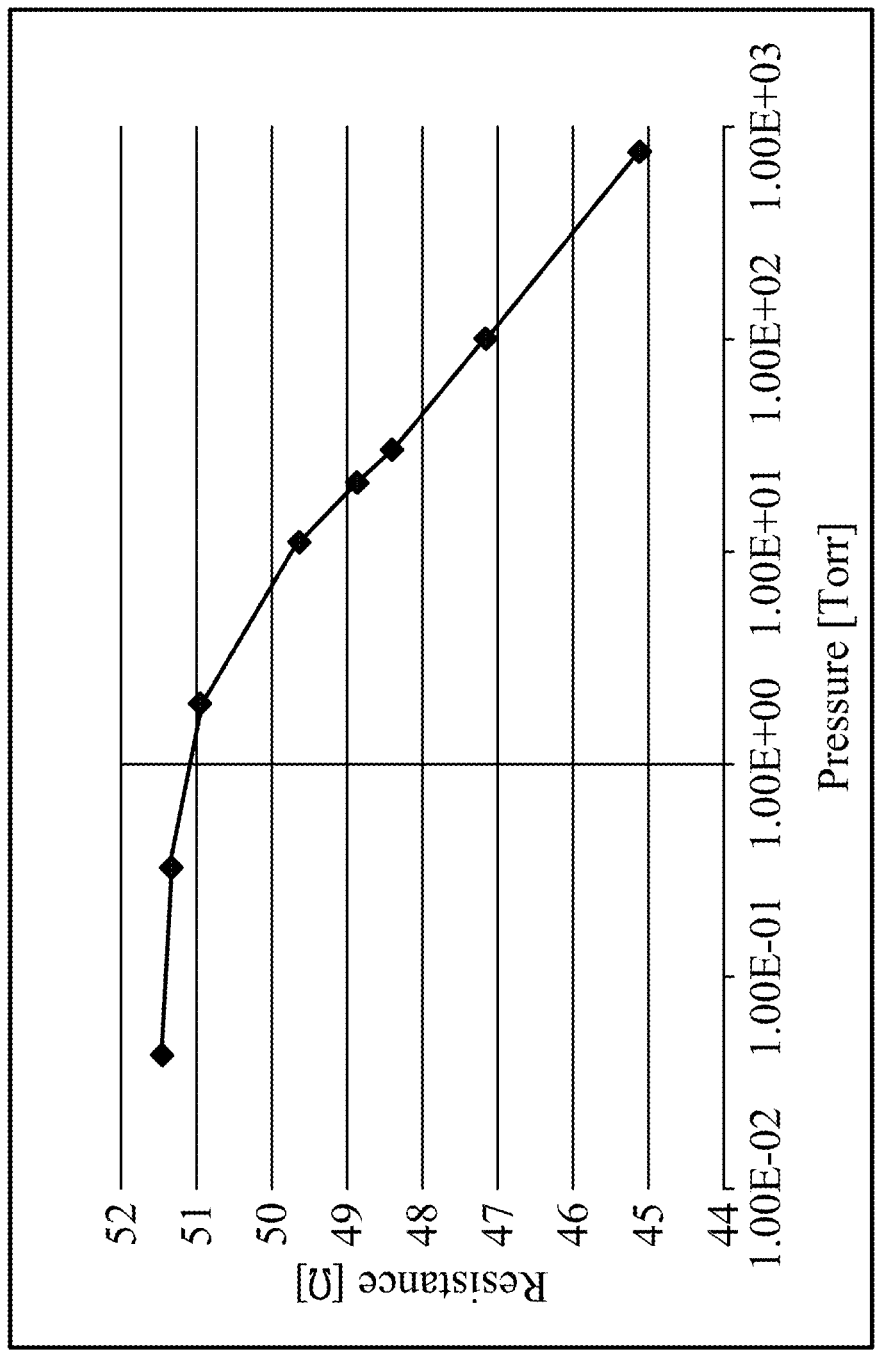
FIG. 3 illustrates the relationship of pressures and resistances of a floating heater of a MEMS device, in accordance with some embodiments.

The MEMS device 100 may have an enlarged range of the substantially linear function of the ambient pressure and the heat loss of the floating heater 112. For example, the MEMS device 100 includes CMOS-MEMS monolithic integration. The MEMS device 100 may be fabricated using CMOS fabrication processes and includes MEMS sensor 102 integrated with a CMOS substrate (e.g., the first substrate 104). The MEMS device 100 may have a size that is in a range from about 1/5~1/50 of that of the Pirani vacuum sensor. Accordingly, the solid conduction and the distance of the air gaps $d_1$, $d_2$, and/or $d_3$ could be lowered to a desirable value since the size of the MEMS sensor 102 is very small. For example, referring to FIG. 3, the MEMS device 100, in some embodiments, detects a pressure ranging from 1 torr to about 1000 torr. It clearly shows that the MEMS device 100 can directly measure pressures near the ambient atmospheric pressure (e.g., 760 torr).

In addition to the large range of the pressures that the MEMS device 100 can detect, the MEMS device 100 is robust and easy to be fabricated. For example, the MEMS device 100 needs no vacuum cavity. The floating heater 112 has a greater thickness than that of the diaphragm electrode of mechanical MEMS altimeter, which makes the floating heater 112 more difficult to be broken and stick to other components.

Figure 4:
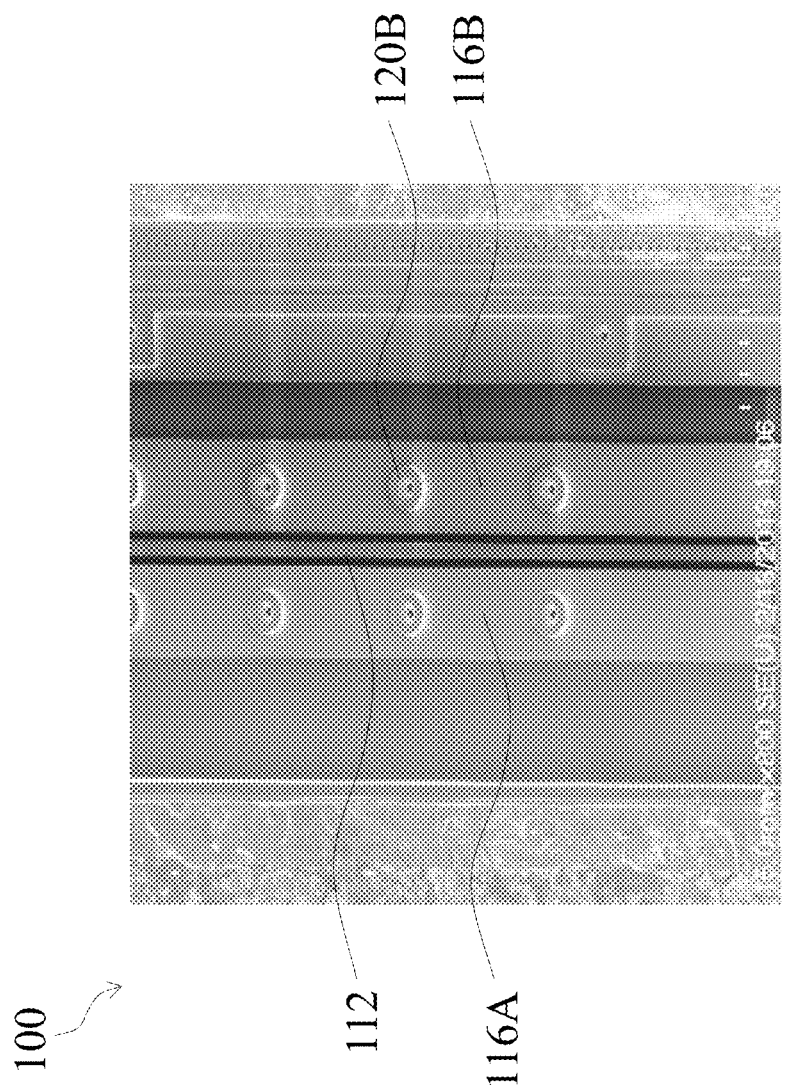
FIG. 4 shows a scanning electron microscopy (SEM) image of a MEMS device, in accordance with some embodiments.

FIG. 4 shows a scanning electron microscopy (SEM) image of the MEMS device 100, in accordance with some embodiments. In FIG. 4, the floating heater 112, the first heat sink 116A, the second heat sink 116B, the air gaps $d_2$ and $d_3$ and the vias 120B of the MEMS device 100 are clearly shown.

Figure 5:
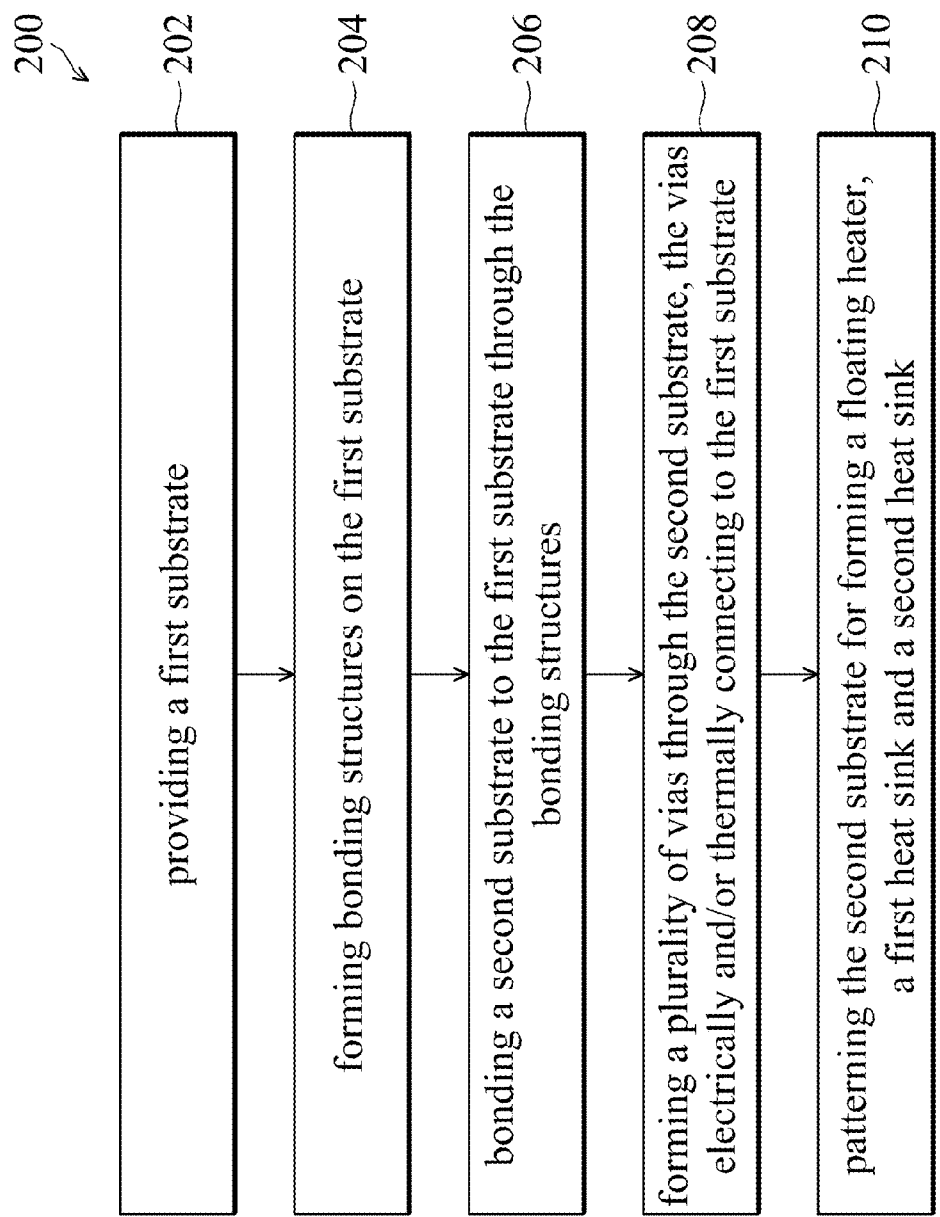
FIG. 5 illustrates a method for manufacturing a MEMS device in flowchart format, in accordance with some embodiments.

To illustrate some embodiments of how such a MEMS device can be manufactured, FIG. 5 illustrates a somewhat general manufacturing method 200 in flowchart format. The method 200 starts with operation 202, in which a first substrate is provided. The method 200 continues with operation 204, in which bonding structures are formed over the first substrate. The method 200 continues with operation 206, in which a second substrate is bonded to the first substrate through the bonding structures. The method 200 continues with operation 208, in which vias are formed through the second substrate. The vias are electrically and/or thermally connected to the first substrate. The method 200 continues with operation 208, in which the second substrate is patterned for forming a floating heater and a heat sink.

FIGS. 6-11 collectively illustrate a more detailed manufacturing method of a MEMS device as a series of cross-sectional views. However, it will be appreciated that although the methods illustrate a number of acts, not all of these acts are necessarily required, or other non-illustrated acts may also be present. Also, the ordering of the acts in some embodiments can vary from what is illustrated in these figures. In addition, the illustrated acts can be further divided into sub-acts in some implementations, while in other implementations some of the illustrated acts can be carried out concurrently with one another.

Referring to FIG. 6, the first substrate 104 is provided, in accordance with some embodiments. In some embodiments, the first substrate 104 is a CMOS substrate which is fabricated by CMOS fabrication processes and includes passive and active devices features. The first substrate 104 may further include the conductive bonds 110 which provide external connections, such as electrical and thermal connections. In some embodiments, the conductive bonds 110 include conductive strips 110A that are formed near the center of the first substrate 104 and a conductive ring 110B that is formed near the edges of the first substrate 104.

Referring to FIG. 7, the bonding structures 118 are formed over the first substrate 102, in accordance with some embodiments. For example, the bonding structures 118 are formed on the conductive strips 110A. The bonding structures 118 may be formed using any suitable technique, such as CVD or PVD, or the like. The bonding structures 118 may undergo a thinning process (e.g., CMP) to achieve a desirable value for the air gap $d_1$.

Figure 8:
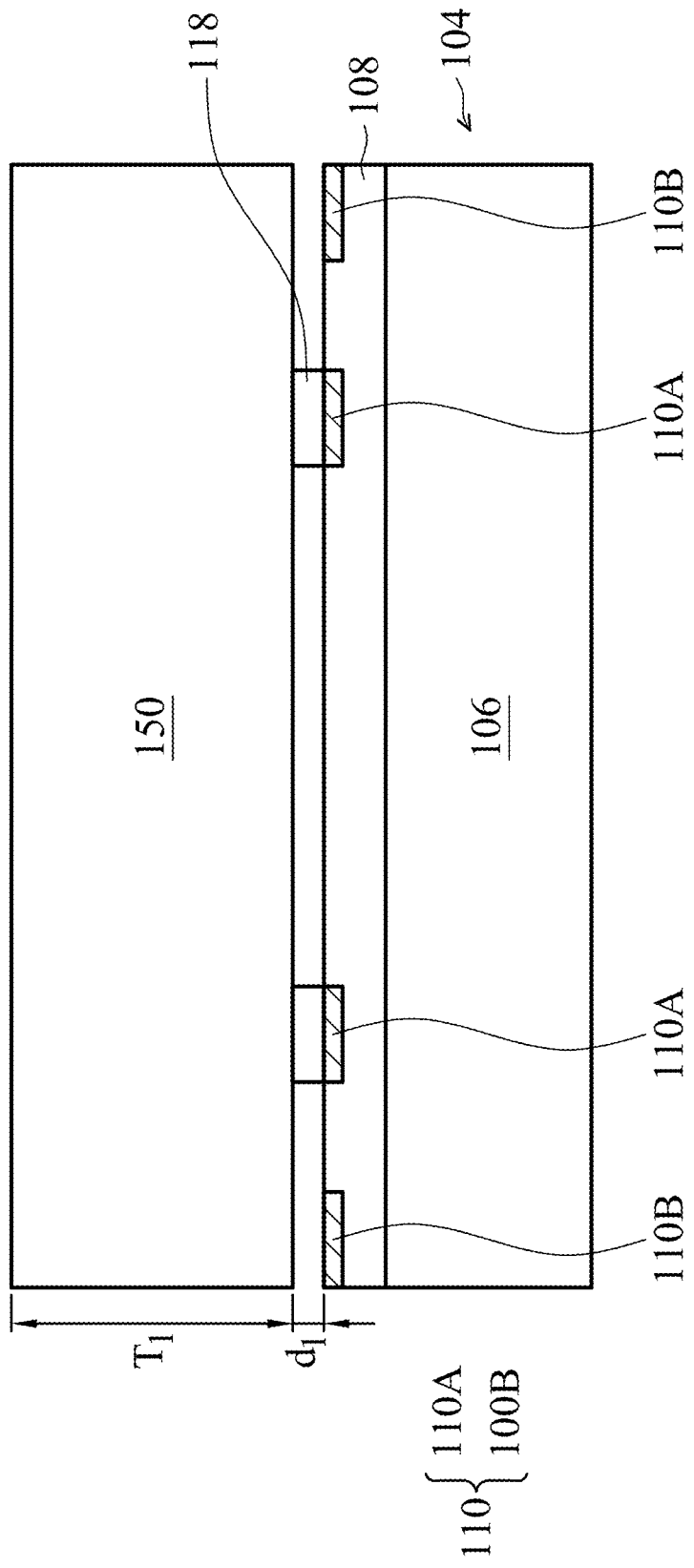

Referring to FIG. 8, a second substrate 150 is bonded to the first substrate 104 through the bonding structures 118, in accordance with some embodiments. The second substrate 150 may be made of polysilicon, although it may be also made of other materials such as, silicon oxide or the like. In some embodiments, the second substrate 150 undergoes a thinning process (e.g., CMP process) to achieve the desired thickness. For example, the second substrate 150 may have a thickness $T_1$ ranging from about 10 μm to about 100 μm.

Figure 9:
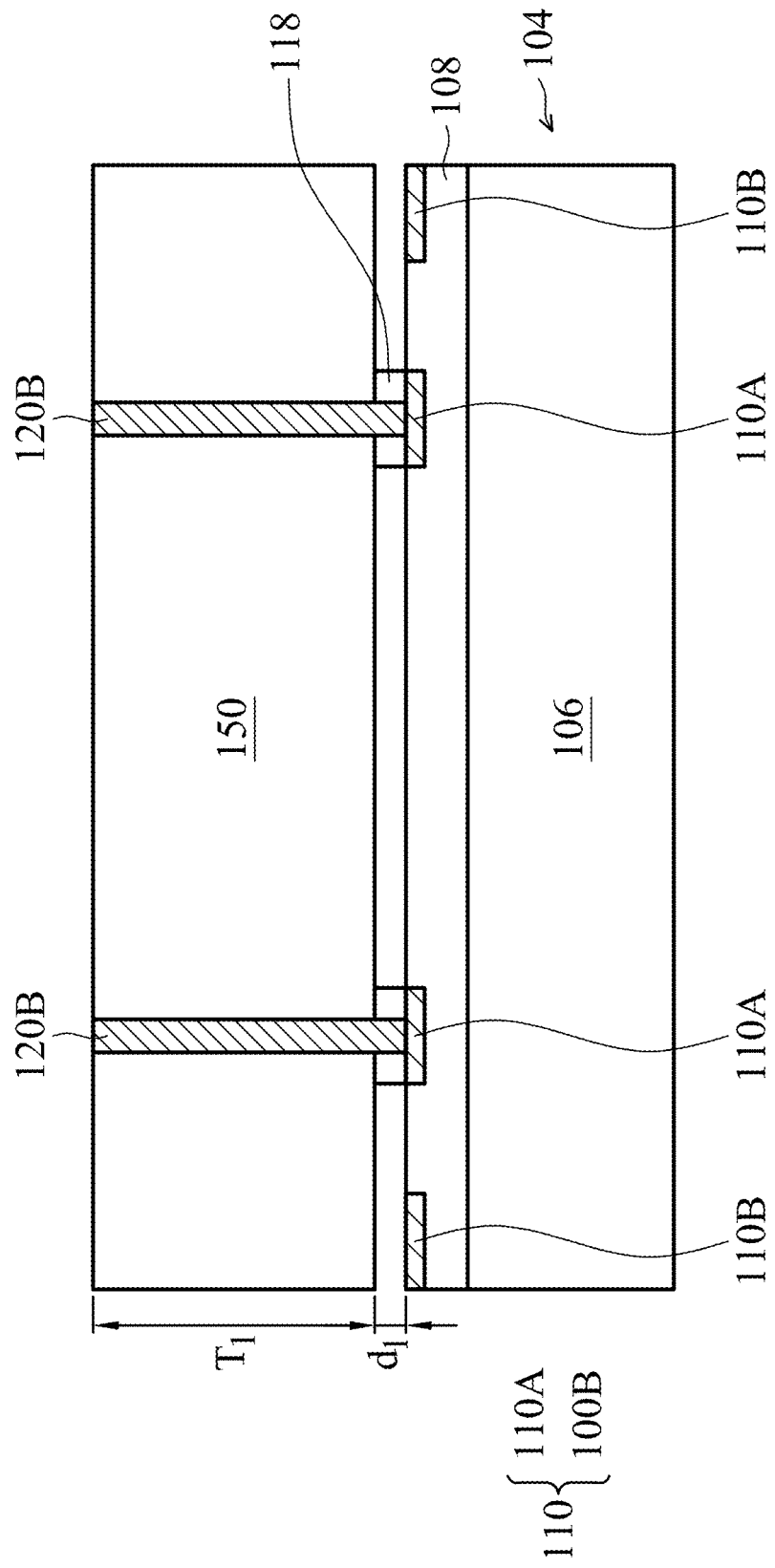

Referring to FIG. 9, the vias 120B are formed through the second substrate 150 and the bonding structures 118, in accordance with some embodiments. The vias 120B are connected to the conductive strips 110A for dissipating heat to the first substrate 104. The vias 120B may be formed by etching holes through the second substrate 150 and then depositing a thermal conductive material into the vias. In some embodiments, the vias 120A (not shown in FIG. 9, shown in FIG. 1) are formed in the same fabrication process with the vias 120B.

Figure 10:
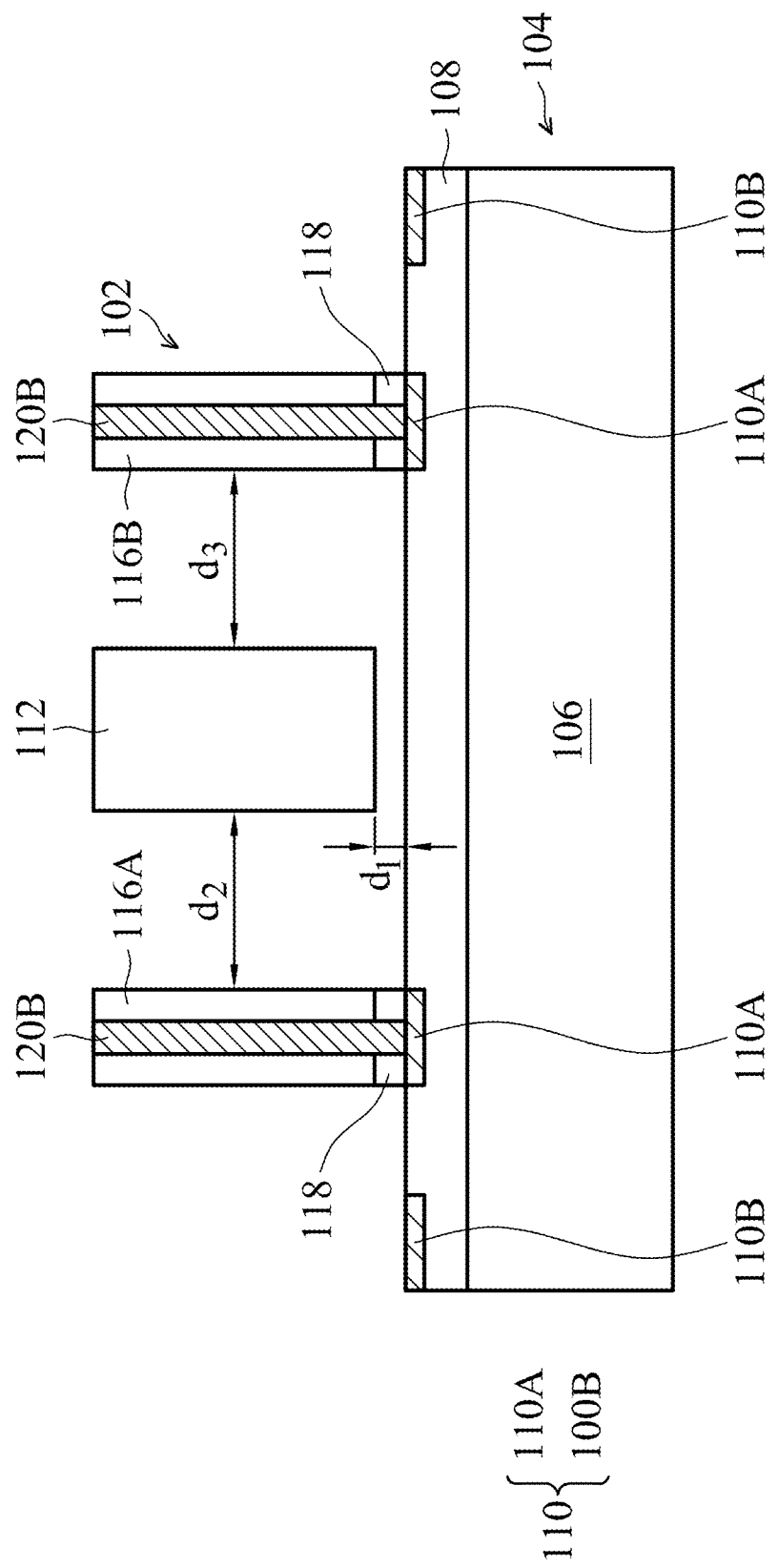

Referring to FIG. 10, the second substrate 150 is patterned into the floating heater 112 and the first and second heat sinks 116A and 116B, in accordance with some embodiments. The patterning process may be accomplished by depositing a mask material (not shown) such as photoresist or silicon oxide over the second substrate 150. The mask material is then patterned and the second substrate 150 is etched in accordance with the pattern. In some embodiments, the two anchors 114 (not shown in FIG. 10, shown in FIG. 1), which are used to support the floating heater 112, are also formed in the patterning process. After the pattering process, the floating heater 112 may have the air gap $d_1$ with the first substrate 104, the air gap $d_2$ with the first heat sink 116A, and the air gap $d_3$ with the second heat sink 116B. The air gap $d_1$ may be determined by the thickness of the bonding structures 118. The air gaps $d_2$ and $d_3$ may be determined by the patterning process. Therefore, it is easy to precisely control the air gaps $d_1$, $d_2$ and $d_3$.

Figure 11:
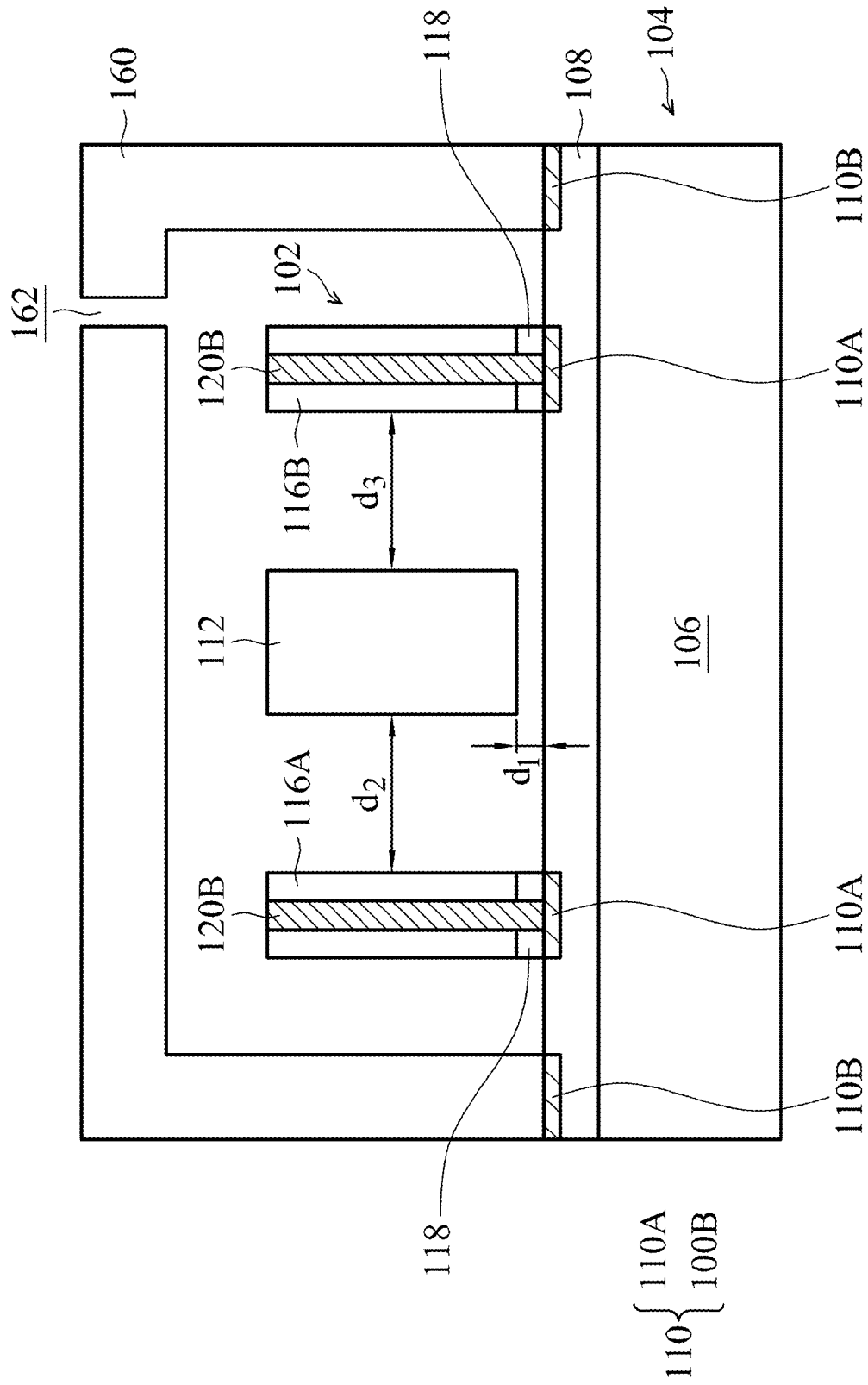

Referring to FIG. 11, a cap substrate 160 is bonded to the first substrate 104 through the conductive ring 110B, in accordance with some embodiments. The cap substrate 160 may provide protection to the MEMS sensor 102 from not being damaged in the subsequent processes. The cap substrate 160 may include a semiconductor substrate, dielectric substrate, or another applicable substrate. In some embodiments, the cap substrate 160 is a silicon substrate including one or more openings 162 for allowing gas molecules to enter the air gaps $d_1$, $d_2$ and $d_3$. The cap substrate 160 may be bonded to first substrate 104 by eutectic bonding, thermo-compression bonding, or another applicable bonding technique. The opening 162 may be drilled by laser, plasma etching, or etc. The opening 162 may be located at any location of the cap substrate 160, including the top or sidewalls.

Figure 12:
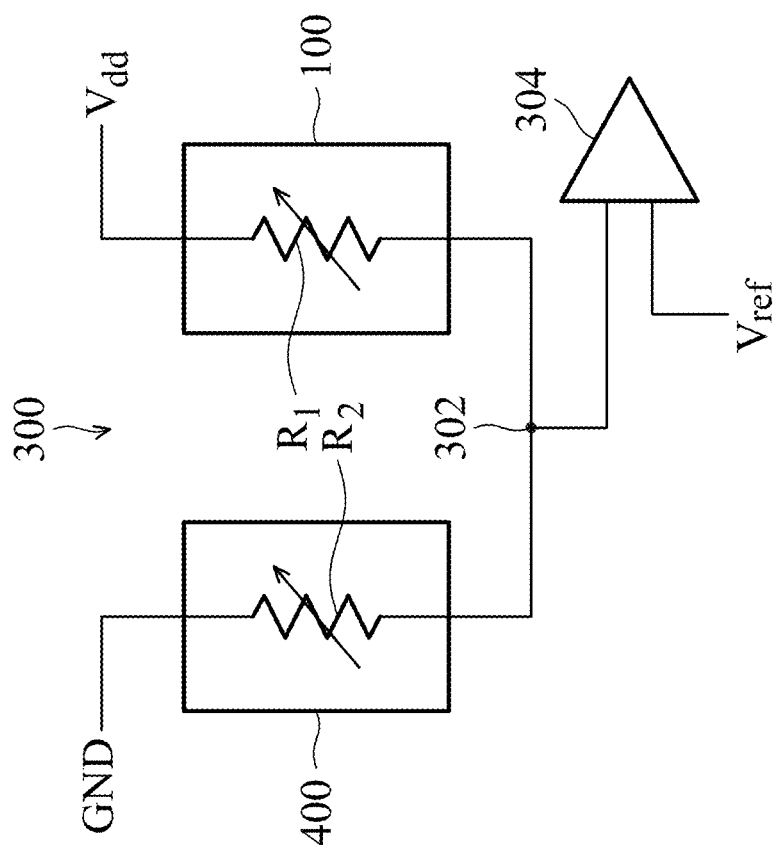
FIG. 12 shows an equivalent circuit diagram of a system of MEMS devices, in accordance with some embodiments.

In addition, to further cancel the influences of the temperature and material fluctuations, a system 300 for MEMS devices is provided. FIG. 12 shows an equivalent circuit diagram of the system 300 of MEMS devices, in accordance with some embodiments. The system 300 may include the MEMS device 100 and a reference MEMS device 400. The reference MEMS device 400 may be the same as the MEMS device 100 except that the reference MEMS device 400 does not include the heat sinks 116A and 116B and the vias 120B. In some embodiments, the floating heater 112 of the MEMS device 100 has a resistance $R_1$, and the floating heater of the reference MEMS device 400 has a resistance $R_2$. The resistances $R_1$ and $R_2$ are variable with the temperature. The MEMS device 100 may receive a $V_{dd}$ voltage, and the reference MEMS device 400 may receive to a ground voltage GND. The MEMS device 100 and the reference MEMS 400 may be coupled to a node 302. The reference MEMS device 400 may help cancel the ambient temperature and material fluctuations of the MEMS device 100. In addition, the node 302 may be coupled to a comparator 304, and a reference voltage is provided to the comparator 304 to compare with the violating at the node 302.

It will be appreciated that some embodiments relate to mechanisms for fabricating a MEMS device detecting pressure and/or height by thermal conductivity are provided. In some embodiments, the fabrication of the MEMS device includes CMOS-MEMS monolithic integration to shrink the size and enhance signal quality. Accordingly, the MEMS device is capable of detecting pressures near the ambient atmospheric pressure. In addition, the MEMS device is robust, which has no stiction and breakage issues when compared to mechanical MEMS sensor devices.

In accordance with some embodiments, a MEMS device is provided. The MEMS device includes a substrate and a MEMS sensor over the substrate. The MEMS sensor includes a floating heater disposed over the substrate. The MEMS sensor also includes a heat sink disposed over the substrate and at a side of the floating heater, and the heat sink has an air gap with the floating heater. The MEMS sensor further includes a first plurality of vias formed through the heat sink and thermally connected to the first substrate.

In accordance with some embodiments, a system for MEMS devices is provided. The system includes a first MEMS device. The first MEMS device includes a first floating heater over a first substrate. The first MEMS device also includes a heat sink disposed over the first substrate and at a side of the first floating heater, and the heat sink has a first air gap with the first floating heater. The first MEMS device further includes a plurality of vias formed through the heat sink and thermally connected to the first substrate. The system also includes a reference MEMS device coupled to the first MEMS device. The reference MEMS device includes a second floating heater disposed over a second substrate.

In accordance with some embodiments, a method for forming a MEMS device is provided. The method includes providing a first substrate. The method also includes bonding a second substrate to the first substrate through a bonding structure. The method further includes forming a plurality of vias at least penetrating through the second substrate and thermally connected to the first substrate. In addition, the method includes patterning the second substrate for forming a floating heater and a heat sink. The plurality of vias is in the heat sink, and the heat sink is at a side of the floating heater and has an air gap with the floating heater.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A micro-electro mechanical system (MEMS) device, comprising:
   a substrate;
   a MEMS sensor over the substrate, wherein the MEMS sensor comprises:
   a floating heater disposed over the substrate;
   a heat sink disposed over the substrate and at a side of the floating heater, wherein the heat sink has an air gap with the floating heater; and
   a first plurality of vias formed through the heat sink and thermally connected to the first substrate; and
   a bonding structure below the heat sink and above the substrate, wherein the first plurality of vias penetrate through the bonding structure without penetrating through the substrate.

2. The MEMS device as claimed in claim 1, wherein the floating heater is made of a semiconductor material.

3. The MEMS device as claimed in claim 1, wherein the floating heater is supported by two anchors which are secured to the substrate.

4. The MEMS device as claimed in claim 3, wherein the two anchors are at two opposite sides of the floating heater, and the two opposite sides are different from the side where the heat sink is located.

5. The MEMS device as claimed in claim 3, wherein the two anchors are made of a semiconductor material.

6. The MEMS device as claimed in claim 1, wherein the air gap is in a range from about 1 µm to about 5 µm.

7. The MEMS device as claimed in claim 1, wherein the floating heater has a thickness ranging from about 10 µm to about 100 µm.

8. The MEMS device as claimed in claim 1, wherein a plurality of conductive bonds located below the bonding structure and above the substrate, and each of the first plurality of vias penetrating through the bonding structure is in contact with a corresponding one of the plurality of conductive bonds.

9. The MEMS device as claimed in claim 1, further comprising another heat sink formed at a side of the floating heater opposite to the heat sink.

10. The MEMS device as claim in claim 1, further comprising a cover formed over the substrate.

11. A micro-electro mechanical system (MEMS) device, comprising:
    a substrate;

a MEMS sensor over the substrate, wherein the MEMS sensor comprises:
    a floating heater disposed over the substrate, wherein the floating heater is supported by two anchors which are secured to the substrate;
    a heat sink disposed over the substrate and at a side of the floating heater, wherein the heat sink has an air gap with the floating heater;
    a first plurality of vias formed through the heat sink and thermally connected to the first substrate; and
    a second plurality of vias formed in and through the two anchors.

12. A system for MEMS devices, comprising:
  a MEMS device configured to receive a $V_{dd}$ voltage, comprising:
    a first floating heater disposed over a first substrate;
    a heat sink disposed over the first substrate and at a side of the first floating heater, wherein the heat sink has a first air gap with the first floating heater; and
    a plurality of vias formed through the heat sink and thermally connected to the first substrate; and
  a reference MEMS device configured to receive a ground voltage and coupled to the first MEMS device, the reference MEMS device comprising:
    a second floating heater disposed over a second substrate.

13. The system as claimed in claim 12, further comprising a comparator coupled to MEMS device and the reference MEMS device.

14. The system as claimed in claim 13, wherein a reference voltage is provided to the comparator.

15. The system as claimed in claim 13, wherein the first floating heater and the second floating heater comprise the same semiconductor material.

16. The system as claimed in claim 13, wherein each of the first floating heater and the second floating heater has a thickness in a range from about 10 µm to about 100 µm.

17. The system as claimed in claim 13, wherein there is no heat sink and via in the reference MEMS device.

18. A micro-electro mechanical system (MEMS) device, comprising:
  a substrate;
  a MEMS sensor over the substrate, wherein the MEMS sensor comprises:
    a floating heater suspended over the substrate;
    a heat sink at a side of the floating heater, wherein the heat sink is separated from the floating heater by a gap; and
    a conductive via formed in the heat sink; and
  a bonding structure below the heat sink and above the substrate, wherein the conductive via penetrates through the bonding structure without penetrating through the substrate.

19. The MEMS device as claim in claim 18, wherein the conductive via penetrates through the heat sink and is connected to a conductive stripe on the substrate.

20. The MEMS device as claim in claim 19, wherein the conductive stripe located below the bonding structure and above the substrate, and the conductive via penetrating through the bonding structure is in contact with the conductive stripe.

* * * * *